US006326695B1

United States Patent
Numata

(12) United States Patent
(10) Patent No.: US 6,326,695 B1
(45) Date of Patent: Dec. 4, 2001

(54) TWISTED BIT LINE STRUCTURES AND METHOD FOR MAKING SAME

(75) Inventor: Ken Numata, Tsuchiura (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/405,263

(22) Filed: Sep. 23, 1999

Related U.S. Application Data

(60) Provisional application No. 60/102,369, filed on Sep. 29, 1998.

(51) Int. Cl.$^7$ ..................................................... H01L 29/41
(52) U.S. Cl. ............................................................... 257/776
(58) Field of Search .................................... 257/379, 386, 257/758, 776

(56) References Cited

U.S. PATENT DOCUMENTS

| | | |
|---|---|---|
| 5,534,732 * | 7/1996 | DeBrosse . |
| 5,821,592 * | 10/1998 | Hoenigschmid et al. . |
| 6,034,879 * | 3/2000 | Min et al. . |
| 6,084,307 * | 7/2000 | Keeth . |

FOREIGN PATENT DOCUMENTS 2000-252440 * 9/2000 (JP) .

* cited by examiner

*Primary Examiner*—George Fourson
(74) *Attorney, Agent, or Firm*—W. James Brady, III; Frederick J. Telecky, Jr.

(57) ABSTRACT

A twisted bit line structure (69) in an integrated memory circuit, and method for making it are presented. The structure is constructed by forming bit line traces (70–73) on an integrated circuit substrate using phase shift lithography techniques. Using these techniques, the bit line traces are arranged with a plurality of substantially parallel bit lines trace segments (70, 70'; 71, 71'; 72, 72'; 73, 73') with discontinuous regions between segments of each trace along a path substantially perpendicular to the bit line traces. Thus, each "phase π" bit line trace is adjacent a "phase 0" bit line trace along two perpendicular axes. A twist connection (74) is formed between first segments (72, 71') of a center pair (71, 72) of said bit line trace segments, and a bit line twist interconnection (82) is formed between second segments (71, 72') of said center pair of said bit line trace segments on a second integrated circuit level from a level containing the bit line traces. Linear interconnections (75, 76) are also formed between segments of outside bit line segments (70, 70'; 73, 73') to form continuous untwisted bit lines. The linear interconnections are also formed on an integrated circuit level different from the level containing the bit line traces.

8 Claims, 4 Drawing Sheets

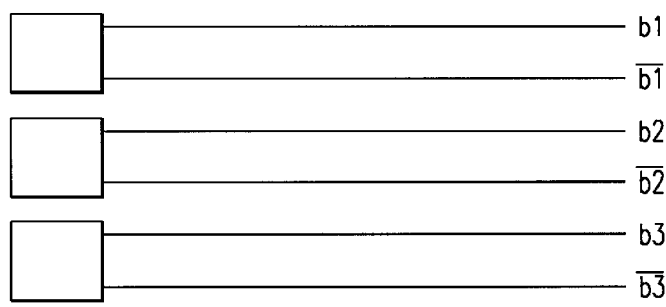
FIG. 2a
(PRIOR ART)
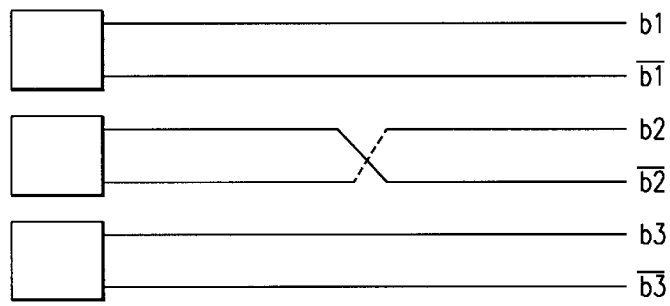
FIG. 2b
(PRIOR ART)
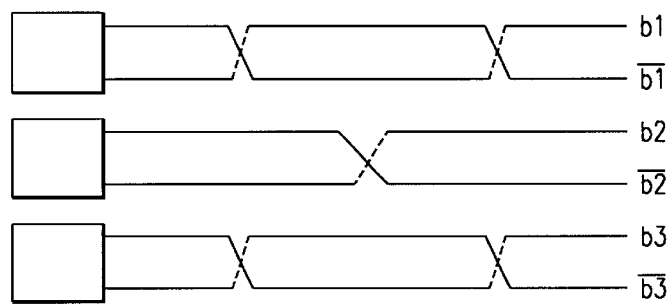
FIG. 2c
(PRIOR ART)
FIG. 3 (PRIOR ART)
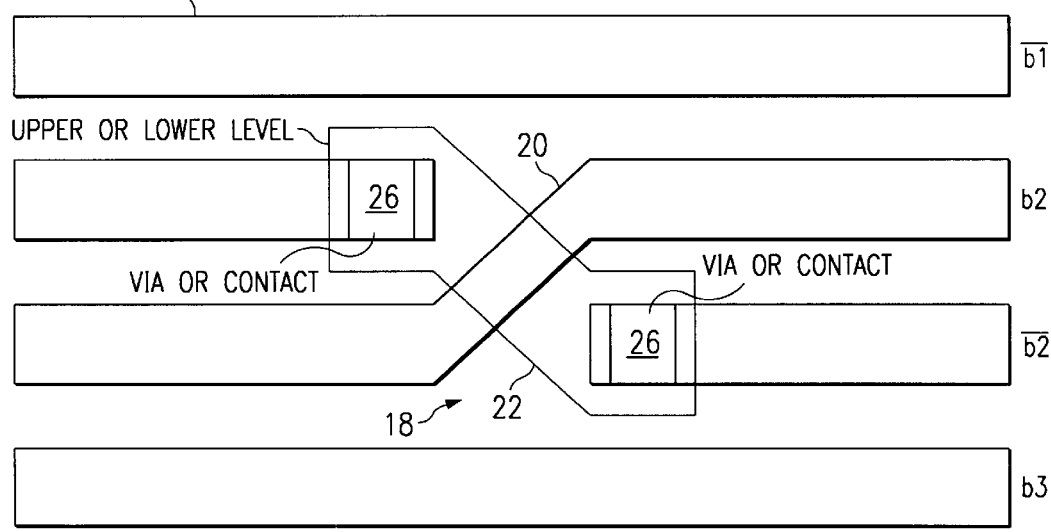

TWISTED BIT LINE STRUCTURES AND METHOD FOR MAKING SAME

This application claims priority under 35 USC §119(e)(1) of provisional application No. 60/102,369 filed Sep. 29, 1998.

BACKGROUND OF THE INVENTION

1. Field of the Invention

This invention pertains to improvements in memory cell array layouts and designs, and more particularly to improvements in memory cell bit line structures, and still more particularly to improvements in twisted bit line structures and methods for making same.

2. Relevant Background

An electrical schematic diagram of a portion 10 of a memory array in which the bit line structure and method for making it in which the invention may be practiced is shown in FIG. 1. As well known, the memory array includes a number of word lines w1 . . . w6, and complementary bit line pairs b1, b2, b2, b3, and so on.

Sensing amplifiers 12, 12', 12", . . . are provided in association with each bit line pair. As known, when noise, denoted by the arrows 14—14 appears across a pair of bit of lines, such as bit lines b2 and b2, the noise may conducted to the sensing amplifier 12', and may erroneously be interpreted as data, lack of data, or undesirably modified data.

Is well known that by twisting bit line structures in integrated circuits, such as memory cells, or the like, noise that may be induced into the bit line structure can be effectively canceled. Various bit line layouts are shown in FIG. 2. For example, in FIG. 2a, a bit line arrangement is shown in which no twist exists within the bit line pairs. This is similar to the bit line arrangement of the memory array of FIG. 1. In FIG. 2b, a bit line arrangement is shown in which the twist is provided in a bit line pair located between two untwisted bit line pairs. This twist arrangement results in significantly better noise cancellation than the untwisted layout of FIG. 2a, but does not provide perfect noise cancellation. In FIG. 2c, a bit line arrangement is shown in which the twist is provided in each bit line pair, with the twist arranged in a staggered relationship with respect to each other. This bit line arrangement provides the best noise cancellation of the three examples shown in FIG. 2.

More particularly, the physical layout of a typical bit line twist structure is shown in FIG. 3. As shown, bit line b1 and b3 are continuous, but complementary bit lines b2 and b2 are interconnected with a twist structure 18. In order to accomplish the twist, bit lines b2 and b2 are made discontinuous so that the respective ends of the bit line b2 and bit line b2 can be interconnected.

Thus, a diagonal conducting trace 20 is provided between bit line b2 on the right and bit line b2 on the left in a continuous pattern. All of the bit lines and the diagonal interconnect 20 are formed on a single level, for example, on a dielectric layer of an underlying substrate (not shown). In order to connect the left side of bit line b2 to the right side of bit line b2, an upper or lower level diagonal interconnect 22 is employed. The interconnect 22 is connected to the associated bit line segments of b2 and b2 through vias 24 and 26, and is formed in a vertical location separated from the bit line segments by a dielectric layer (not shown). Typically the interconnect 22 is formed above the level of the bit line traces, but, as mentioned, can be formed at a lower level.

Thus, conventionally, bit line structures are laid out on a semiconductor substrate by a number of parallel conductive traces. At pre-determined locations, the traces are formed in a discontinuous manner, with a diagonal interconnection made between the first set of the conductive traces and, on a different integrated circuit level, with a second diagonal interconnection between the second trace portions, with connections made to the traces by vias or other inter-level interconnections.

Thus, in the past, bit line construction has been accomplished by depositing a number of the metal traces onto a semiconductor substrate, with spaced apart diagonal conductors formed between selected adjacent bit lines and with discontinuities in the respective lines that will subsequently be interconnected. After an insulating layer has been formed over the bit line structure, vias are formed through the insulating layer to the surfaces of the discontinuous bit lines. Thereafter, a diagonal conductor segment is formed to interconnect the discontinuous bit lines through the vias. Of course, the vertical order and placement of the diagonal interconnection may be varied, with the diagonal interconnection being first formed and the bit line structure being formed over an insulating layer in which are properly located vias may have been formed.

Thus, in order to construct twisted bit lines, a first bit line is typically constructed at an original level, and portions or segments of a second bitline are constructed parallel to the first bit line. However, in order for the second and bit line to be constructed without shorting to the first as it crosses thereover, an interconnection must be provided that is insulated from the first bit line. Such interconnection is generally constructed to be located either over or under the first and separated therefrom by a suitable insulation layer; typically, the interconnections of the second bit line are located at an upper level that is separated and insulated from the first bit line.

It should be noted that in the past, in the formation of the bitlines, a reticle has been used in which a number of opaque parallel line segments are formed on a glass substrate. The opaque parallel line segments may be formed, for example, of chromium or other material on the glass or other transparent substrate. The reticle is placed on or adjacent a surface of a substrate on which a photosensitive material has been deposited. Light is passed through the reticle, and is masked by the opaque line segments formed thereon but allowed to pass by the adjacent transparent line segments, to expose unmasked portions of the photosensitive material to the light. This causes a chemical change in the material that allows selected portions (for example, the light exposed portions) of the material to be removed.

However, since the typical scales patterned on wafers are comparable to the wave length of the light used in lithography equipment, the resulting pattern on the photosensitive material on the substrate therefore may have blurred or fuzzy edge definitions. When they photo sensitive material is removed during subsequent processing steps, the blurred or fuzzy edge definition may result an an in inaccurate patterning, which, in turn, may result in unintended contact between adjacent memory array structures, such as the bit lines of concern herein.

To address this problem, a so-called "Levenson" reticle has been proposed in which selected portions of the glass substrate between masked elements are etched. The etched regions are, referred to as "π" regions, or "phases," and the unetched regions are referred to as "0" regions, or "phases". By careful selection of the "π" and "0" regions, a pattern can be produced onto a semiconductor device having known semiconductor processing layers thereon which have sharply defined edges. Since the etched portions of the reticle are lower than the unetched portions, light passing through the reticle has a smaller light path, and therefore causing interference patterns, on the photo resist or substrate being patterned. This results in significantly better integrated circuit structure formation. In fact, it has been estimated that a Levenson reticle can produce line patterns with approximately twice the resolution of that of a conventional reticle.

The process by which the bit lines are formed includes the exposure of a photo sensitive layer (not shown) that has been deposited or formed onto the surface of the substrate on which the bit lines are to be constructed. In the past, a reticle mask 30 has been provided, as shown in FIG. 4a. The reticle mask includes a number of mask elements 32 formed on a surface 30 formed in of a glass substrate 36. The mask elements 32 may be, for example, metal, such as chromium or the like. Typical scales on wafers are comparable to the wave length of the light used in lithography equipment. As a result, light that passes through the inter-spaces between the mask elements 32 produces interference patterns on the photo sensitive substrate when it is exposed. A typical pattern from a conventional reticle mask is shown in FIG. 4b. This results in imprecise line patterns, which can lead to shorting between adjacent bit line structures, especially as feature sizes in integrated circuit devices becomes smaller and smaller.

SUMMARY OF THE INVENTION

In light of the above, it is, therefore, an object of the invention to provide an improved method for making an improved twisted bit line.

It is another object of the invention to provide a method for constructing twisted bit lines using a "Levenson" mask, in which bit line diagonal connections can be made between bit line structures according to the Levenson phase shift layout rules.

It yet another object of the invention to provide and improved bit line structure.

It is still another object of the invention to provide an improved pits line structure of the type described that may be more reliably constructed to avoid inadvertent shorts or contacts to adjoining integrated circuit structures.

These and other objects, features and advantages of the invention will be apparent to those skilled in the art from the following detailed description of the invention, when read in conjunction with the accompanying drawings and appended claims.

Thus, according to the present invention, a method is presented for making twisted bit line structures in an integrated circuit, such as an integrated circuit memory chip, or like, using two Levenson phase shift two rules: 1) structures with different phase must not touch; 2) and geometries, separated by the minimum design rule for the integrated circuit under consideration, should be constructed with different phases. Following these rules, thereover, and in accordance with a preferred embodiment of the present invention, a method is presented for interconnecting selected bit lines to accomplish a twisted bit line structure, by providing an interconnection between bit line segments that are untwisted in locations adjacent to locations at which the twist is provided in an adjacent bit line pair. Thus, if a series of bit line tracts are formed with alternate "π" and "0" phases, interconnections can be made at upper or lower integrated circuit structural levels of both the twisted and untwisted bit line traces, to accomplish the twisted bit line structure.

In accordance with a broad aspect of the invention, therefore, a method for constructing a twisted bit line structure in an integrated memory circuit is presented. The method includes forming bit line traces on an integrated circuit substrate using phase shift lithography techniques. Using these techniques, the bit line traces are arranged with a plurality of substantially parallel bit lines trace segments with discontinuous regions between segments of each trace along a path substantially perpendicular to the bit line traces, with each "phase π" bit line trace being adjacent a "phase 0" bit line trace along two perpendicular axes. A twist connection is formed between first segments of a center pair of said bit line trace segments, and a bit line twist interconnection is formed between second segments of said center pair of said bit line trace segments on a second integrated circuit level from a level containing the bit line traces. Linear interconnections are also formed between segments of outside bit line segments to form continuous untwisted bit lines. The linear interconnections are also formed on an integrated circuit level different from the level containing the bit line traces.

According to another broad aspect of the invention, a twisted bit line structure for an integrated memory circuit is presented. The structure includes a plurality of bit line trace segments. At least a pair of the untwisted bit line trace segments are located adjacent and substantially parallel to an adjacent twisted bit line pair of bit line trace segments. Interconnections are established between discontinuous portions of the bit lines segments of the untwisted bit line segments. The interconnection are contained on a different level from a level on which the bit line segments are contained.

BRIEF DESCRIPTION OF THE DRAWINGS

The invention is illustrated in the accompanying drawing, wherein:

FIGS. 2a–2c are representations of typical layout schemes for memory circuit construction that have, respectively, no twist, twist for each other pair, and twist for each pair.

FIG. 3 is a diagram showing a bit line twist layout, in accordance with the prior art.

In the various drawings, like reference numerals are used to denote like or similar parts. Additionally, the drawings are not necessarily drawn to scale.

DETAILED DESCRIPTION OF THE PREFERRED EMBODIMENTS

Figure 6A:
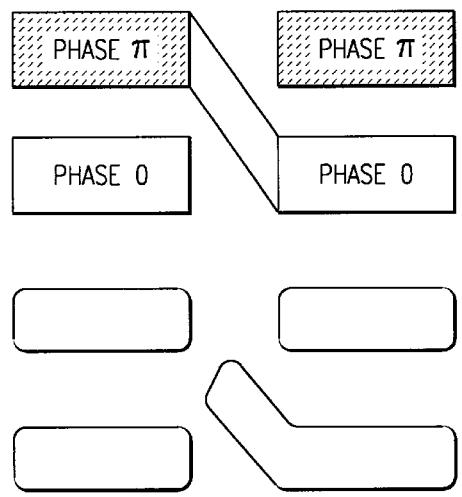
FIGS. 6a and 6b show the results of "Levenson" phase shift rules, wherein respectively the geometries with different phases are intended to touch, and the geometries with the same phase are adjacent each other.
Figure 6B:
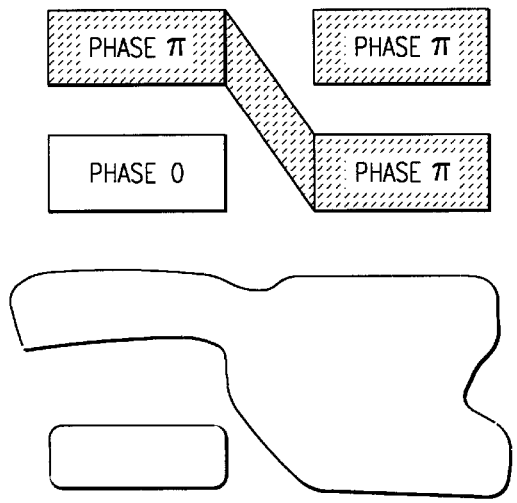

As mentioned, the bit lines formed in accordance with the invention, are made according to two Levenson phase shift rules. The first ruled is that structures with different phase must not touch. The second ruled is that geometries, separated by the minimum design rule for the integrated circuit under consideration, should be constructed with different phases. The origin of the rules can be appreciated from the diagram shown in FIG. 6. Thus, two possible effects of using a Levenson phase shift reticle are shown. In FIG. 6a, it can be seen that a desired interconnection between Aphase π@ and Aphase 0@ regions may result in a disconnect due to the imprecision in light masking, described above. It is noted that the features between opposite phases are crisp and sharp. By the same token, with reference to FIG. 6b, if two phases some of the same type, for example, Aphase π@ were to be adjacent, the light interference may well cause a pattern that produces imprecise pattern differentiating regions, resulting in the conductor material of the adjacent bit lines to short from one bit line to an adjacent bit line, as shown.

Figure 5A:
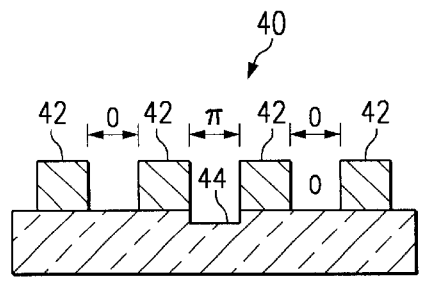
FIGS. 5a and 5b show respectively a side view "Levenson" phase shift reticle used in the construction of bit lines that may be used in a semiconductor memory device, and the exposure pattern formed thereby in accordance with a preferred embodiment of the invention.

As known, a "Levenson" phase shift reticle includes regions on which opaque material 42 has been deposited to form a mask having alternating opaque and transparent regions. In addition, the Levenson reticle has regions of the transparent areas that have been etched, such as region 44, by a sufficient amount to affect a phase shift in the light passing through the reticle to reduce fuzzy edges between traces formed by different phases in the resulting pattern imprinted on a photoresist layer corresponding to the pattern of the mask. The etched regions of the Levenson mask are generally referred to as "phase π" regions, and the unetched transparent regions are generally referred to as "phase 0" regions. Similarly, the bit line traces that are formed through the use of the Levenson reticle are referred to as "phase π" traces or "phase 0" traces, depending upon whether they were patterned by a "phase π" mask region or a "phase 0" mask region. Thus, a ALevenson@ phase shift reticle of the type illustrated in FIG. 5a can be used in the following manner.

Figure 1:
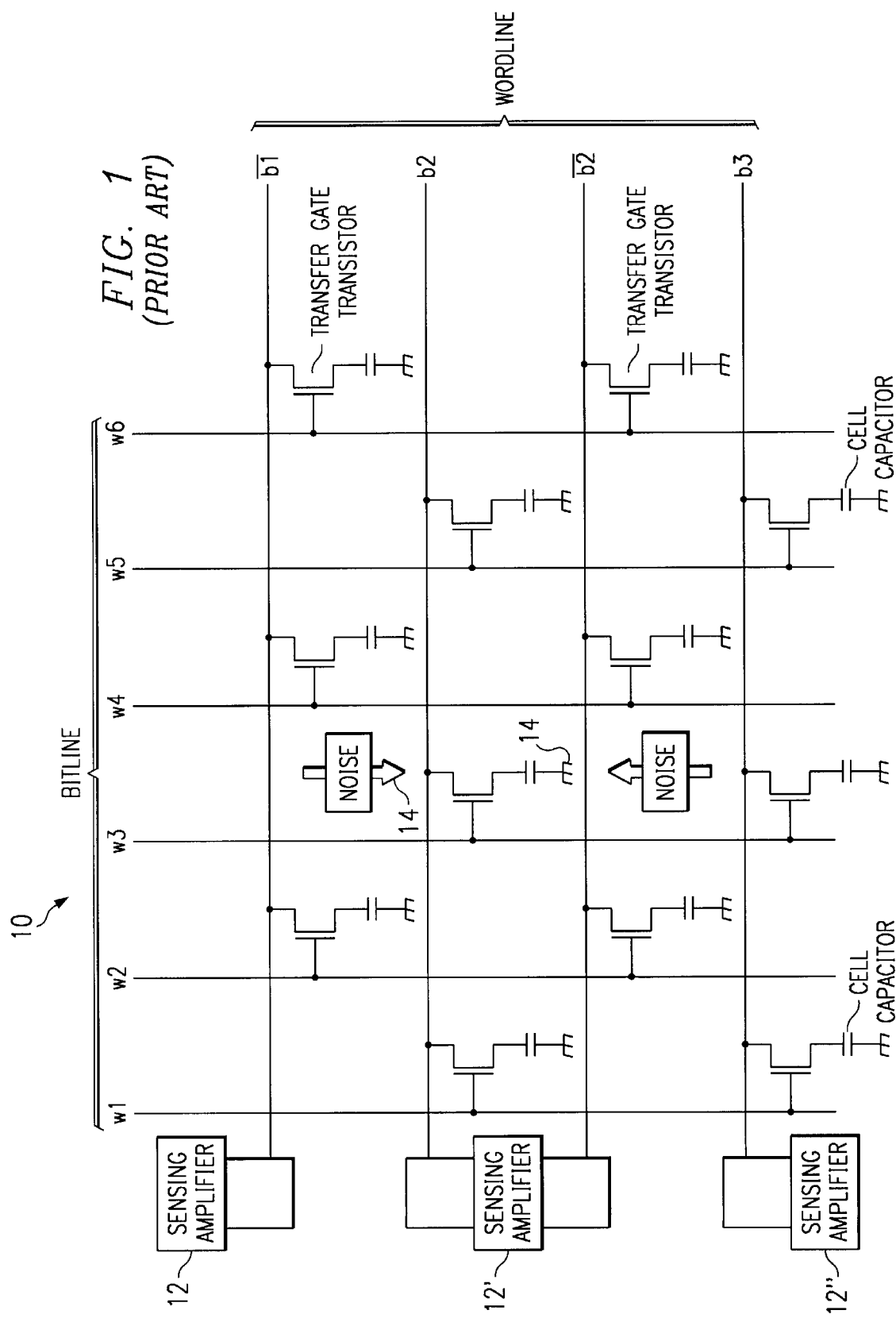
FIG. 1 is an electrical schematic diagram of a portion of a semiconductor integrated circuit memory, according to the prior art, in which a twisted bit line according to the invention may be used.
Figure 4A:
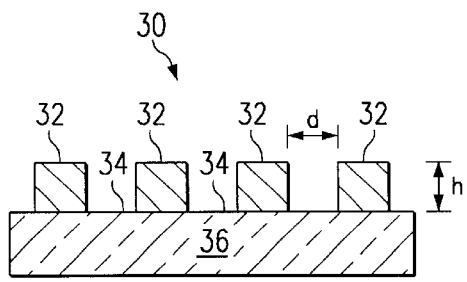
FIGS. 4a and 4b show respectively a side view of a conventional reticle used in a the construction of bit lines that may be used in a semiconductor memory device, and the exposure pattern formed thereby in accordance with the prior art.
Figure 4B:
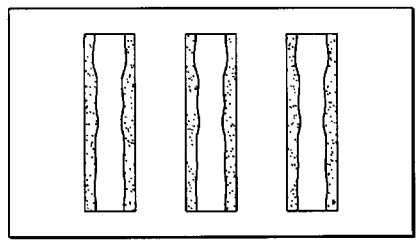
Figure 5B:
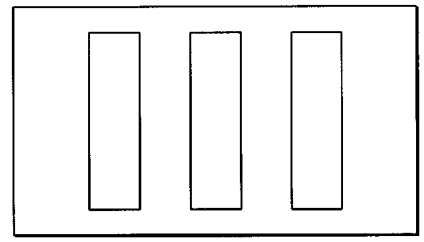

The Levenson reticle 40 is used to mask light inpingent thereupon that to allow selected portions of the light to pass through the transparent regions to expose an underlying the photosensitive layer on the substrate on which an integrated circuit is intended to been built. By careful construction of the Levenson reticle, the pattern that is imprinted into the photosensitive material may be generally as shown in FIG. 5b. It should be noted that the edges of the exposed regions are relatively sharp, in comparison, for example, to the pattern shown in FIG. 4 formed from a conventional reticle mask, described above.

After exposure, regions of the photosensitive material that have not been exposed to light are removed, and the conductive traces that will formed the bit lines are deposited, in well-known manner. In general, it is preferred that the photoresist be a negative resist material.

Figure 7:
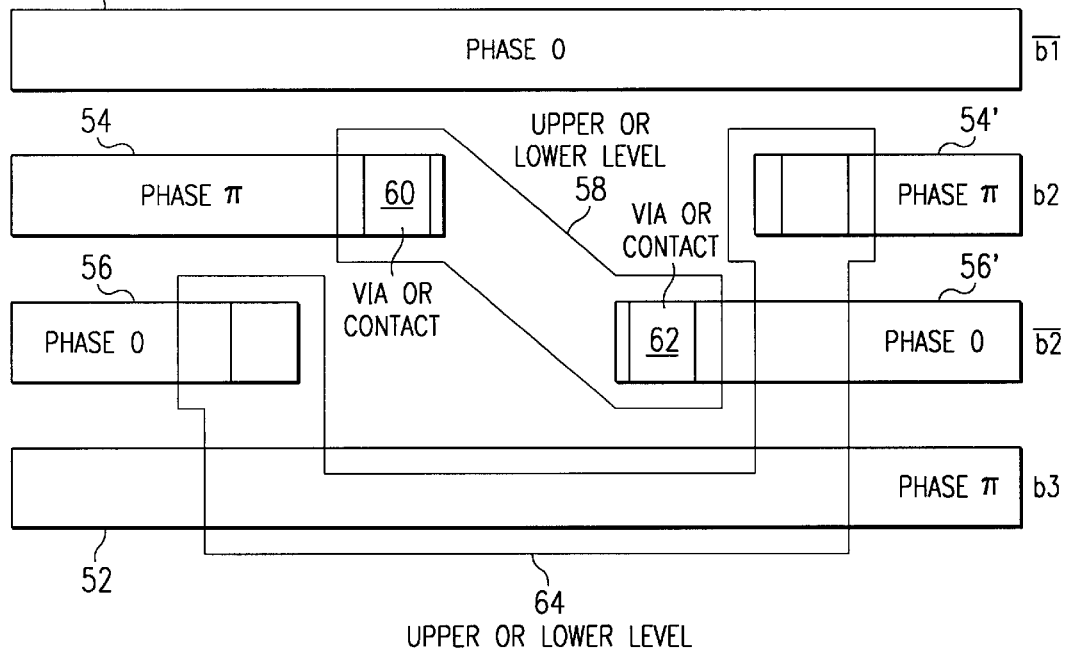
FIG. 7 is a diagram showing a typical bit line layout, in accordance with the prior art.

An example of a bit line twist structure and method it are illustrated in FIG. 7, in which bit lines b1 50 and b3 52 are straight in the areas of adjacent the region at which bit lines b2 54 and b2 56 are twisted. With respect to the twist of bit lines b2 54 and b2 56, an interconnect Ajumper@ 58 is formed to connect the "phase π" segment 54 of bit line b2 to the "phase 0" segment 56' of bit line b2. The interconnect 58 can be formed at an upper or lower level separated from the level at which the bit line traces 50–56 are located and connected to the bit line segments 54' and 56 through the vias 60 and 62. On the other hand, a bit line interconnect segment 64 is provided to interconnect the "phase zero" segment 56 of the bit line b2 to the "phase π" and bit line segment 54' of the bit line B-2. The interconnect segment 64 is routed on a separate level insulated from the layer in which the bit line traces are formed to pass at least partially along its length in parallel with the untwisted bit line b3. Thus, the bit line twist layout meets the criteria set forth above for the Levenson phase shift layout rules.

Figure 8:
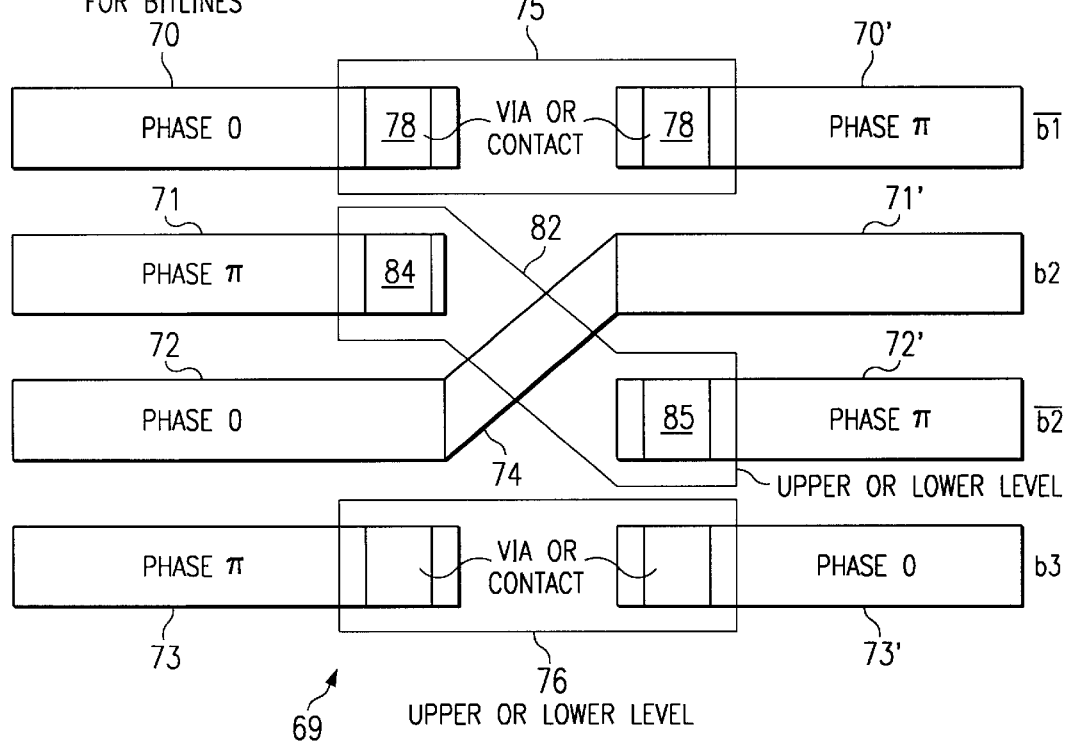
FIG. 8 is a diagram showing a bit line layout in which both twisted and untwisted lines are connected at adjacent locations, in accordance with a preferred embodiment of the invention.

Another preferred layout embodiment is illustrated in FIG. 8 in which each of the bit lines 70 B- 73 are separated along a separation line, wherein each bit line will have a "twist structure" at adjacent relative locations, except for the interconnection of the "phase 0" segment 72 of bit line b2 which is connected to the "phase 0" segment 71' of bit line b2. As before, each of the bit line segments are formed by an appropriately constructed Levenson reticle.

Each of the untwisted bit lines b1 and b3 have respective interconnect segments 75 and 76 arranged to jumper the gap between the "phase zero" and "phase π" segments. The interconnects 75 and 76 may be formed at an upper or lower level of the on integrate circuit, as desired, and connect to the respective bit line traces through vias 78 and 79.

At the same time, the interconnect 82 that completes the twist structure between the bit lines b2 and b2 is provided to connect the "phase π" segments of bit lines b2 and b2, again at an upper or lower integrated circuit level, with interconnects made through vias 84 and 85. Thus, the phases of each of the bit lines that are untwisted are changed from "phase π" to "phase 0", and the phases of the bit lines (b-2 and b2) that are twisted remain the same.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A twisted bit line structure for an integrated memory circuit, comprising:

a pair of untwisted bit line trace segments, associated with an untwisted bit line;

a first pair of twisted bit line trace segments located adjacent and substantially parallel to the pair of untwisted bit line trace segments, the first pair of twisted bit line trace segments being collinear with one another;

a second pair of twisted bit line trace segments located adjacent and substantially parallel to the first pair of twisted bit line trace segments, the second pair of twisted bit line trace segments being collinear with one another;

an untwisted bit line interconnection between said untwisted bit line segments, said untwisted bit line interconnection being contained on a different level from a level on which the untwisted bit line trace segments are contained; and twisted bit line connections, each connected between one of the first pair of twisted bit line trace segments and one of the second pair of twisted bit line trace segments, the twisted bit line connections located away from the untwisted bit line interconnection so as not to pass over or under the untwisted bit line interconnection.

2. The twisted bit line structure of claim 1 wherein said bit line trace segments are metal.

3. The twisted bit line structure of claim 1 wherein said untwisted bit line interconnection is formed at a lower-level from a level on which the untwisted bit line trace segments are contained.

4. The twisted bit line structure of claim 1 wherein said untwisted bit line interconnection is formed at an upper-level from a level on which the untwisted bit line trace segments are contained.

5. A twisted bit line structure for an integrated memory circuit, comprising:

a plurality of bit line segments, corresponding to a subset of four substantially parallel bit lines, with discontinuous regions between the bit line segments of each of said four substantially parallel bit lines;

a diagonal connection between segments of an interior pair of bit line segments in said subset;

linear interconnections between discontinuous portions of the bit line segments associated with the outside two bit lines of the subset, said linear interconnections being contained on a different level from a level on which the bit line segments are contained; and a twist interconnection between discontinuous segments of another interior pair of bit line segments, said interconnection being contained on a different level from a level on which the bit line segments are contained;

wherein the diagonal and twist interconnections are located away from the linear interconnections so as to not pass over or under the linear interconnections.

6. The twisted bit line structure of claim 5 wherein said bit line segments are metal.

7. The twisted bit line structure of claim 5 wherein said linear interconnections and said twist interconnection are formed at an upper level from a level on which the bit line segments are contained.

8. The twisted bit line structure of claim 5 wherein said linear interconnections and said that twist interconnection are formed at a lower-level from a level on which the bit line segments are contained.

* * * * *